United States Patent
Cheng et al.

(10) Patent No.: US 10,102,615 B2
(45) Date of Patent: Oct. 16, 2018

(54) METHOD AND SYSTEM FOR DETECTING HOTSPOTS IN SEMICONDUCTOR WAFER

(71) Applicant: Taiwan Semiconductor Manufacturing Co., Ltd., Hsinchu (TW)

(72) Inventors: Wen-Hao Cheng, Hsinchu (TW); Peng-Ren Chen, Hsinchu (TW); Chih-Chiang Tu, Taoyuan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 118 days.

(21) Appl. No.: 15/378,482

(22) Filed: Dec. 14, 2016

(65) Prior Publication Data

US 2018/0165803 A1    Jun. 14, 2018

(51) Int. Cl.
*G06K 9/00* (2006.01)
*G06T 7/00* (2017.01)

(52) U.S. Cl.
CPC .. *G06T 7/0004* (2013.01); *G06T 2207/30148* (2013.01)

(58) Field of Classification Search
CPC ............... H01L 22/34; H01L 22/12; G06T 2207/30148; G06T 7/0004
USPC ............................................. 382/149; 348/92
See application file for complete search history.

(56) References Cited

U.S. PATENT DOCUMENTS

| | | | | |
|---|---|---|---|---|
| 6,035,244 A | * | 3/2000 | Chen | G06F 11/2268 700/110 |
| 7,729,529 B2 | * | 6/2010 | Wu | G01N 21/95607 382/144 |
| 8,731,275 B2 | * | 5/2014 | Harada | G06T 7/001 382/149 |
| 2011/0296362 A1 | * | 12/2011 | Ishikawa | G06T 7/001 716/112 |
| 2012/0185818 A1 | * | 7/2012 | Leu | G03F 1/84 716/136 |
| 2013/0176558 A1 | | 7/2013 | Lin et al. | |

* cited by examiner

*Primary Examiner* — Daniel Mariam
(74) *Attorney, Agent, or Firm* — McClure, Qualey & Rodack, LLP

(57) ABSTRACT

Methods and system for detecting hotspots in semiconductor wafer are provided. At least one semiconductor wafer is inspected to detect a plurality of hotspots of each die in the semiconductor wafer, wherein each of the hotspots has defect coordinates in a layout of the die. The hotspots of the dies are stacked in the layout according to the defect coordinates of the hotspots. A common pattern is obtained according to the stacked hotspots corresponding to a location with specific coordinates in the layout. It is determined whether the common pattern is a known pattern having an individual identification (ID) code. A new ID code is assigned to the common pattern when the common pattern is an unknown pattern.

20 Claims, 8 Drawing Sheets

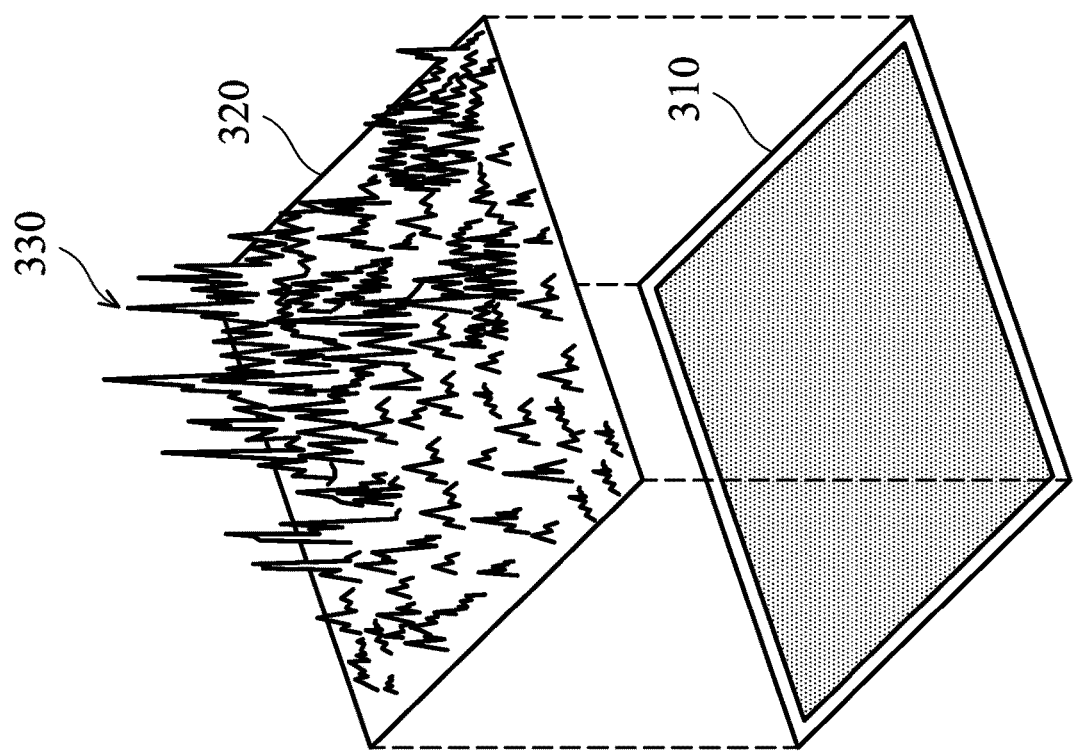
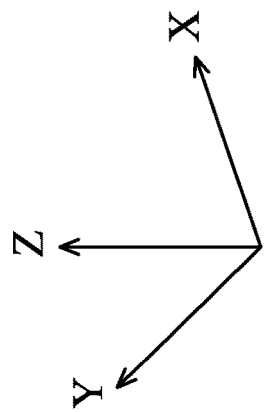
FIG. 3

| ROI | ID code |
|---|---|
| SRAM | 1000-1XXX |
| Dummy | 2000-2XXX |
| Critical Logic | 3000-3XXX |
| Non-Critical Logic | 4000-4XXX |
| Hotspot | 5000-5XXX |

FIG. 7

METHOD AND SYSTEM FOR DETECTING HOTSPOTS IN SEMICONDUCTOR WAFER

BACKGROUND

In semiconductor technology, wafers having multiple chips are produced in a wafer fabrication facility (FAB) using a plurality of processes and stages. Each process or stage can introduce one or more defects into the semiconductor wafer, which can lead to issues with quality and reliability, failures, and reductions in yield. To improve manufacturing technologies and enhance wafer quality, reliability, and yield, the semiconductor wafers are measured, tested, monitored, and inspected at each process and stage.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 3 shows a schematic view of a hotspot distribution in one example, in accordance with some embodiments of the disclosure.

FIG. 7 shows a table of ID codes in one example, in accordance with some embodiments of the disclosure.

DETAILED DESCRIPTION

Figure 1:
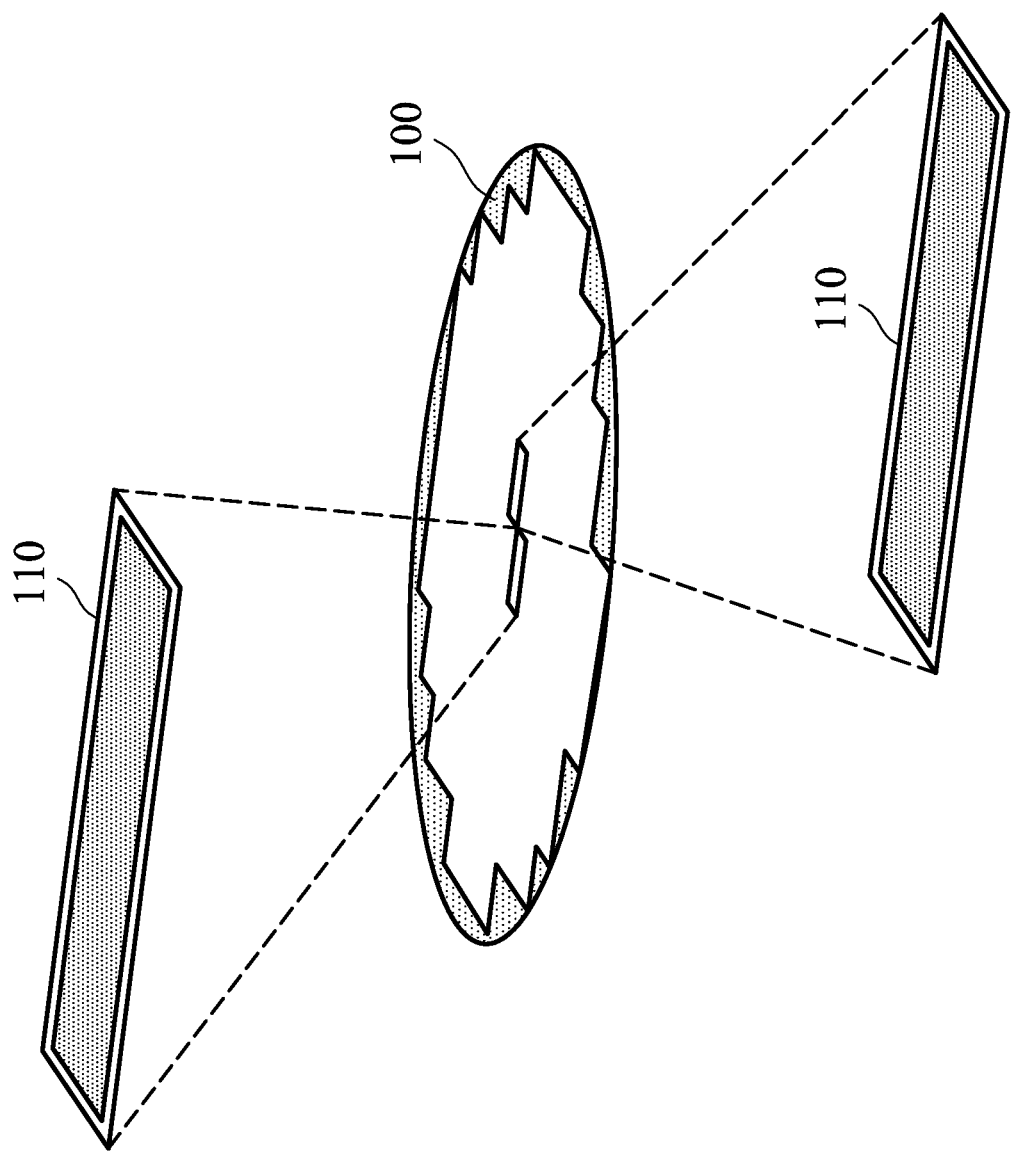
FIG. 1 shows a semiconductor wafer to be inspected, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. In some embodiments, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

In integrated circuit (IC) design, a variety of functions are integrated into one chip, and an application specific integrated circuit (ASIC) or system on a chip (SOC) cell based design is often used. In this approach, a library of known functions is provided, and after the functional design of the device is specified by choosing and connecting these standard functions, and proper operation of the resulting circuit is verified using electronic design automation (EDA) tools, the library elements are mapped on to predefined layout cells, which contain prefigured elements such as transistors. The cells are chosen with the particular semiconductor process features and parameters in mind to create a process parameterized physical representation of the design. The design flow continues from that point by performing placement and routing of the local and global connections needed to form the completed design using the standard cells.

After design rule checks, design rule verification, timing analysis, critical path analysis, static and dynamic power analysis, and final modifications to the design, a tape-out process is performed to produce photomask generation data. This photomask generation (PG) data is then used to create the optical masks used to fabricate the semiconductor device in a photolithographic process at a wafer fabrication facility (FAB). In the tape-out process, the database file of the IC is converted into a Graphic Database System (GDS) file (e.g. a GDS file or a GDSII file). The GDS file is then used to make various layers of masks for integrated circuit manufacturing. Specifically, the GDS file became the industry's standard format for transfer of IC layout data between design tools of different vendors.

Inspection processes are used in various steps of the semiconductor manufacturing process to detect defects on wafers according to GDS files, so as to promote higher yield in the manufacturing process and thus higher profits. Furthermore, as the dimensions of semiconductor devices decrease, inspection becomes even more important to the successful manufacture of acceptable semiconductor devices because smaller defects can cause the devices to fail. For instance, as the dimensions of semiconductor devices decrease, the detection of smaller defects has become necessary since even relatively small defects may cause aberrations in the semiconductor devices. Moreover, as design rules shrink, semiconductor manufacturing processes may be operating closer to the limitations on the performance capability of the processes, and smaller defects can have an impact on the electrical parameters of the device.

FIG. 1 shows a semiconductor wafer 100 to be inspected, in accordance with some embodiments of the disclosure. The semiconductor wafer 100 includes a plurality of dies 110. The dies 110 are identical and separated from each other by the scribing lines. During various processes, the semiconductor wafer 100 is inspected to detect defects on the dies 110. The defects are related to insufficient space and/or line width margins, and the defects are also referred to as hotspots. If an inspection result is normal, the subsequent process or stage is performed on the semiconductor wafer 100. If the semiconductor wafer 100 has not been completed, the next process is performed on the semiconductor wafer 100. Similarly, after performing the next process, the semiconductor wafer 100 will be inspected again until all the processes of the semiconductor wafer 100 have been completed. If the semiconductor wafer 100 has been completed, the semiconductor wafer 100 is diced along the scribing lines, and the dies 110 are obtained. Next, a plurality of integrated circuits (ICs) are fabricated based on the obtained dies 110.

Figure 2:
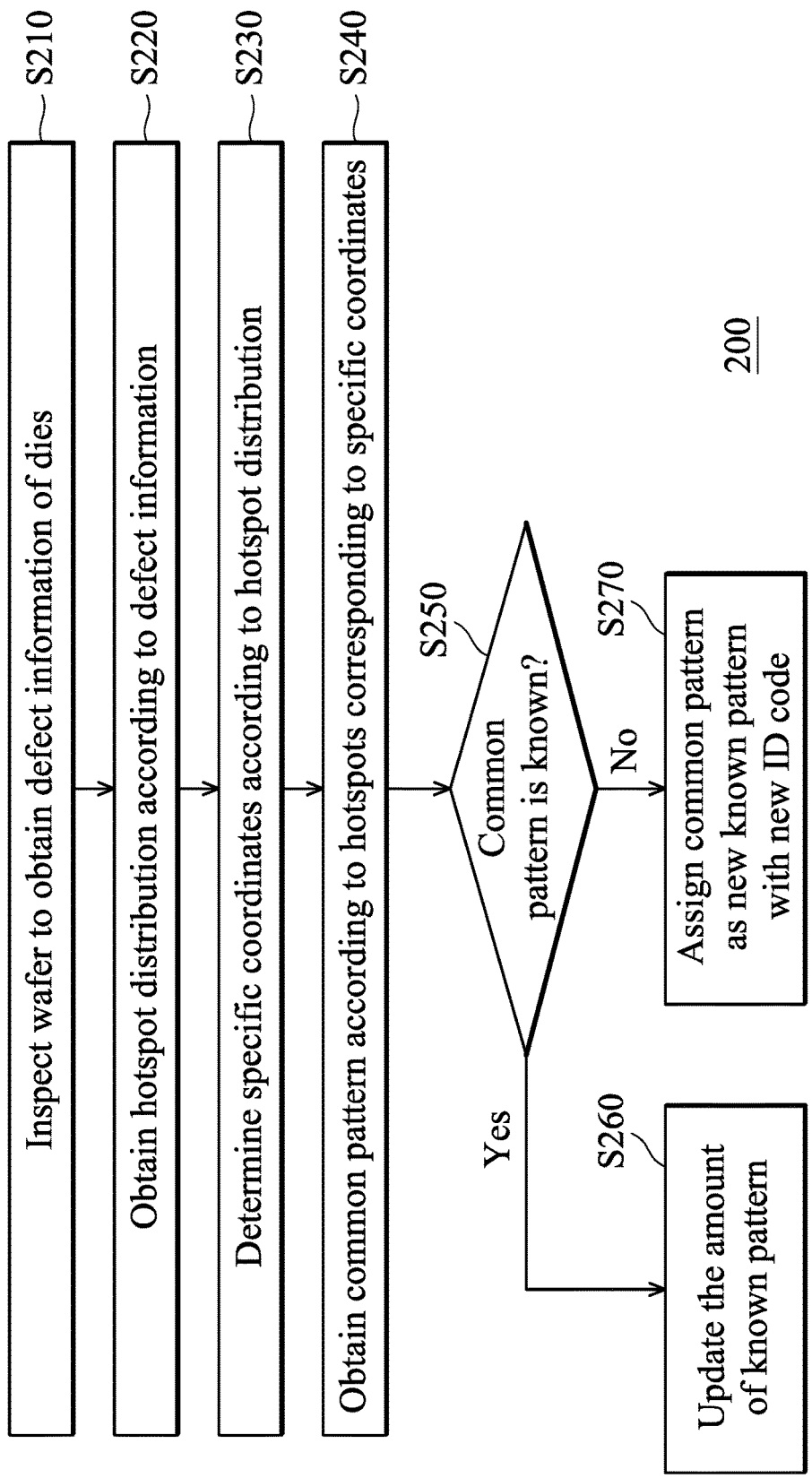
FIG. 2 shows a simplified flowchart of a method for detecting hotspots in a semiconductor wafer, in accordance with some embodiments of the disclosure.

FIG. 2 shows a simplified flowchart of a method 200 for detecting hotspots in a semiconductor wafer, in accordance with some embodiments of the disclosure. It should be noted that additional processes may be provided before, during, and/or after the method 200 of FIG. 2, and that some processes may only be briefly described herein. Furthermore, the method 200 of FIG. 2 can be performed in one or more process or stage of manufacturing the semiconductor wafers.

At least one semiconductor wafer is inspected by an inspection apparatus (operation S210), and the semiconductor wafer (e.g. 100 of FIG. 1) includes a plurality of dies (e.g. 110 of FIG. 1). When each die is inspected, the inspection apparatus is capable of detecting whether any hotspot is present in the die. If a hotspot (e.g. insufficient space and/or line width margin) is detected in the die, a defect signal is provided by the inspection apparatus. The defect signal includes information regarding the defect coordinates of the hotspot, and the defect coordinates represent a single location of the hotspot in the layout. In some embodiments, the information further includes the position of the die in the semiconductor wafer. In some embodiments, a plurality of semiconductor wafers are inspected, and the hotspots of the dies of the semiconductor wafers are detected.

After obtaining the defect signals of the dies in the one or more semiconductor wafers, a hotspot distribution is obtained (operation S220) by stacking the hotspots of the dies in the layout according to the defect coordinates of the defect signals, i.e. the defect signals are accumulated. By stacking the inspection defect sites corresponding to the hotspots from multiple dies of the one or more semiconductor wafers, the defect signals are enhanced.

Referring to FIG. 3, FIG. 3 shows a schematic view of a hotspot distribution 320 in one example, in accordance with some embodiments of the disclosure. In FIG. 3, the hotspot distribution 320 is obtained according to a plurality of defect signals from a plurality of dies of one or more semiconductor wafers. The dies have the same layout 310.

The hotspot distribution 320 is a three-dimensional (3D) distribution. The plane coordinates of the hotspot distribution 320 includes the X-axis and the Y-axis, and the plane coordinates of hotspot distribution 320 are identical the layout 310. Furthermore, the Z-axis of the hotspot distribution 320 represents the amount of the hotspots in the plane coordinates. Therefore, when the amount of hotspots on the specific coordinates increases, for example, the amount of hotspots on the specific location of the layout increases, there will be a higher peak on the Z-axis of the hotspot distribution 320 corresponding to the specific location.

In some embodiments, the hotspot distribution of a single semiconductor wafer is obtained using the following formula:

$$S_s(x_k, y_k) = \text{Stack}(x_k, y_k) = \Sigma_{j=1}^{ND} DS(D_j, x_k, y_k).$$

For each die of the single semiconductor wafer, the defect signal can be represented as a function DS(D, x, y). The parameter D of the function DS indicates which die the hotspot corresponding to the defect signal is located in. The parameters x and y of the function DS indicate the defect coordinates of the hotspot in the die. Furthermore, the parameter x corresponds to the X-axis, and the parameter y corresponds to the Y-axis. The location (x, y) of the hotspot is binned by a kernel grid. The number of dies in the single semiconductor wafer is denoted by ND.

In some embodiments, the hotspot distribution of multiple semiconductor wafers is obtained using the following formula:

$$S_m(x_k, y_k) = \text{Stack}(x_k, y_k) = \Sigma_{i=1}^{NW} \Sigma_{j=1}^{ND} DS(W_i, D_j, x_k, y_k).$$

For each die of each semiconductor wafer, the defect signal can be represented as a function DS(W, D, x, y). The parameter W of the function DS indicates which wafer the hotspot corresponding to the defect signal is located in. The parameter D of the function DS indicates the hotspot corresponding to the defect signal is located in which die. The parameters x and y of the function DS indicate the defect coordinates of the hotspot in the die. Furthermore, the parameter x corresponds to the X-axis, and the parameter y corresponds to the Y-axis. The location (x, y) of the hotspot is binned by a kernel grid. The number of dies in each semiconductor wafer is denoted by ND, and the number of wafers to be inspected is denoted by NW.

Referring back to FIG. 2, after obtaining the hotspot distribution, a location with specific coordinates is determined by selecting the specific coordinates from the defect coordinates of the defect signals according to a specific rule (operation S230).

In some embodiments, the specific coordinates are determined by selecting the defect coordinates with a higher peak on the Z-axis of the hotspot distribution (e.g. the peak 330 of FIG. 3).

In some embodiments, the specific coordinates are determined by selecting the defect coordinates located outside a plurality of known hotspot areas. In some embodiments, the known hotspot areas are obtained in previous inspections. In some embodiments, the specific coordinates are determined by selecting the defect coordinates with a higher peak on the Z-axis outside the known hotspot areas.

In some embodiments, the specific coordinates are determined by selecting the defect coordinates located in a region-of-interest (ROI) corresponding to a specific circuit type. A plurality of circuit types of the circuits in the die are obtained in advance. In some embodiments, a plurality of regions-of-interest (ROIs) corresponding to the circuit types are classified according to the GDS file and design information. For example, the circuit types may include: memory, critical logic, non-critical logic, dummy, hotspot, and so on. In some embodiments, the specific coordinates are determined by selecting the defect coordinates with a higher peak on the Z-axis located in an ROI corresponding to a specific circuit type. In some embodiments, the ROIs corresponding to the hotspots are the known hotspot areas described above.

Figure 4:
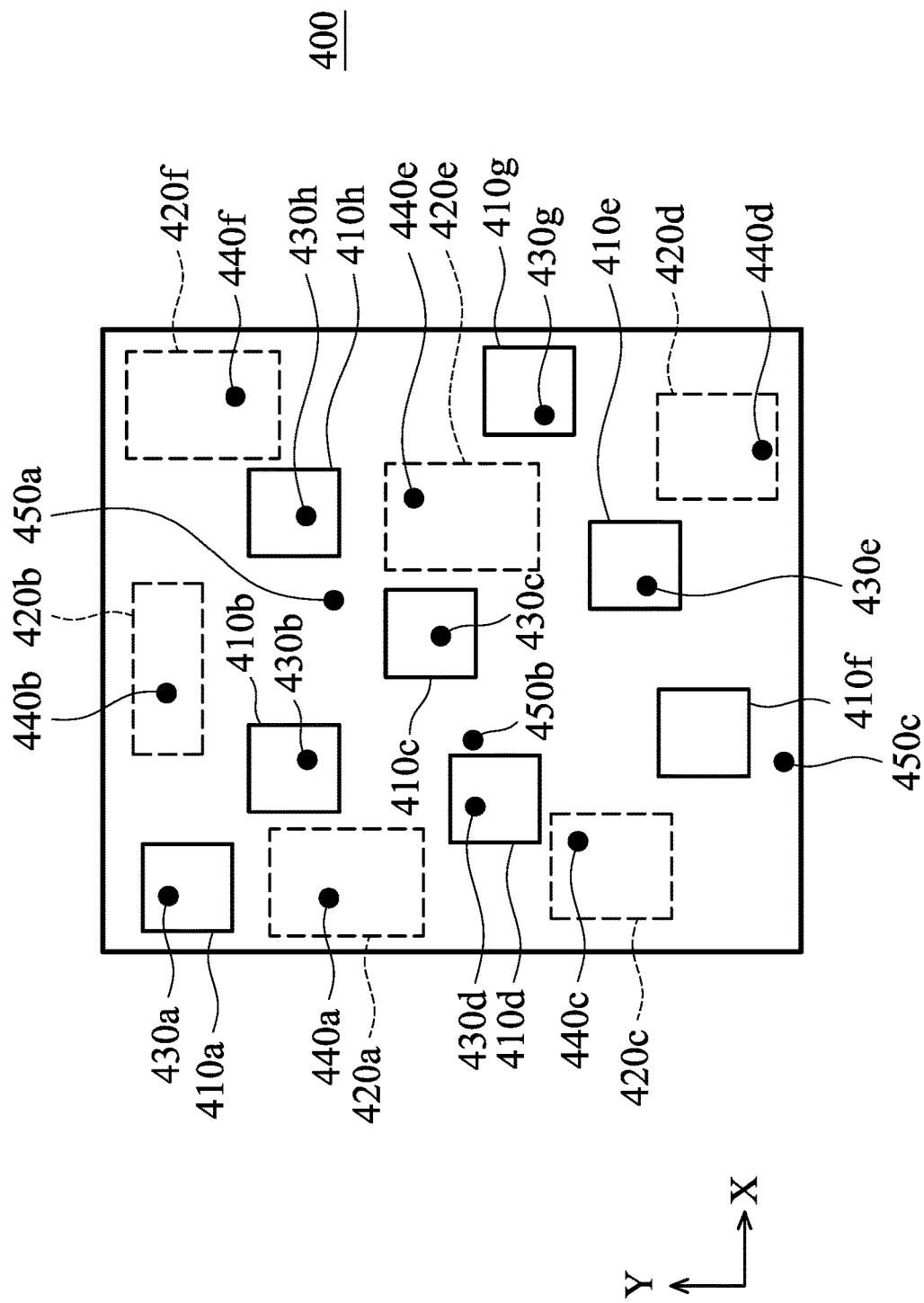
FIG. 4 shows a top view of a hotspot distribution 400 in one example, in accordance with some embodiments of the disclosure.

Referring to FIG. 4, FIG. 4 shows a top view of a hotspot distribution 400 in one example, in accordance with some embodiments of the disclosure. The hotspot distribution 400 includes a plurality of first ROIs 410a-410h and a plurality of second ROIs 420a-420f. In the embodiment, the first ROIs 410a-410h are the ROIs corresponding to hotspots, and the second ROIs 420a-420f are the ROIs corresponding to critical logic.

A plurality of hotspots are detected in a plurality of dies of one or more semiconductor wafers, and the hotspots are shown as black dots in the hotspot distribution 400. In the embodiment, the defect coordinates of the hotspots 430a-430h are located in the first ROIs 410a-410h, and the defect coordinates of the hotspots 440a-440f are located in the second ROIs 420a-420f. Furthermore, the defect coordinates of the hotspots 450a-450c are located outside the first ROIs 410a-410h and the second ROIs 420a-420f.

In some embodiments, specific coordinates are selected from the hotspots 430a-430h, 440a-440f and 450a-450c with a higher peak on the Z-axis of the hotspot distribution 400.

In some embodiments, specific coordinates are selected from the hotspots 450a-450c located outside the first ROIs 410a-410h and the second ROIs 420a-420f.

In some embodiments, specific coordinates are selected from the hotspots 430a-430h located in the first ROIs 410a-410h or the hotspots 440a-440f located in the second ROIs 420a-420f.

Referring back to FIG. 2, after determining the specific coordinates, a common pattern is obtained according to the hotspots corresponding to the specific coordinates (operation S240).

In operation S240, a pattern region corresponding to each stacked hotspot located in the specific coordinates is obtained by clipping a specific size of pattern from the layout. Furthermore, in order to avoid the inspection errors and offsets caused by uncertainty about the coordinates, a pattern region corresponding to each stacked hotspot having the defect coordinates adjacent to the specific coordinates is also obtained by clipping a specific size of pattern from the layout, so as to provide tolerance of uncertain Signal-Stack coordinate inaccuracy. In some embodiments, the uncertainty related to the coordinates is a source of inaccuracy that is due to a stage error.

In some embodiments, the pattern regions are the same size. Furthermore, in each pattern region, the corresponding defect coordinates are located at the center of the pattern region.

According to the pattern regions of the defect coordinates, a common pattern is identified and grouped by using design geometry. For example, a maximal normalized cross-correlation (NCC) between the pattern regions within a kernel grid encompassing an uncertain coordinate is used to obtain the common pattern. Assuming that the pattern regions corresponding to k-th and k'-th defect signals are defined as $PS_k$ and $PS_{k'}$, respectively, a $NCC_{kk'}$ between the pattern regions $PS_k$ and $PS_{k'}$ is obtained using the following formula:

$$NCC_{kk'} = \frac{Cov[PS_k, PS_{k'}]}{\sqrt{Cov[PS_k, PS_k]}\sqrt{Cov[PS_{k'}, PS_{k'}]}}, \text{ where}$$

$$PS_k = PS(x_k, y_k) \text{ and } PS_{k'} = PS(x_{k'}, y_{k'}).$$

$Cov[PS_k, PS_{k'}]$ is a cross covariance matrix of the pattern regions $PS_k$ and $PS_{k'}$, and is obtained using the following formula:

$$Cov[PS_k, PS_{k'}] = E\{[PS_k - E(PS_k)][PS_{k'} - E(PS_{k'})]^T\}.$$

$E\{X\}$ is an expected value of an average (e.g. average$\{X\}$), and T represents the transposition of the matrix.

Figure 5:
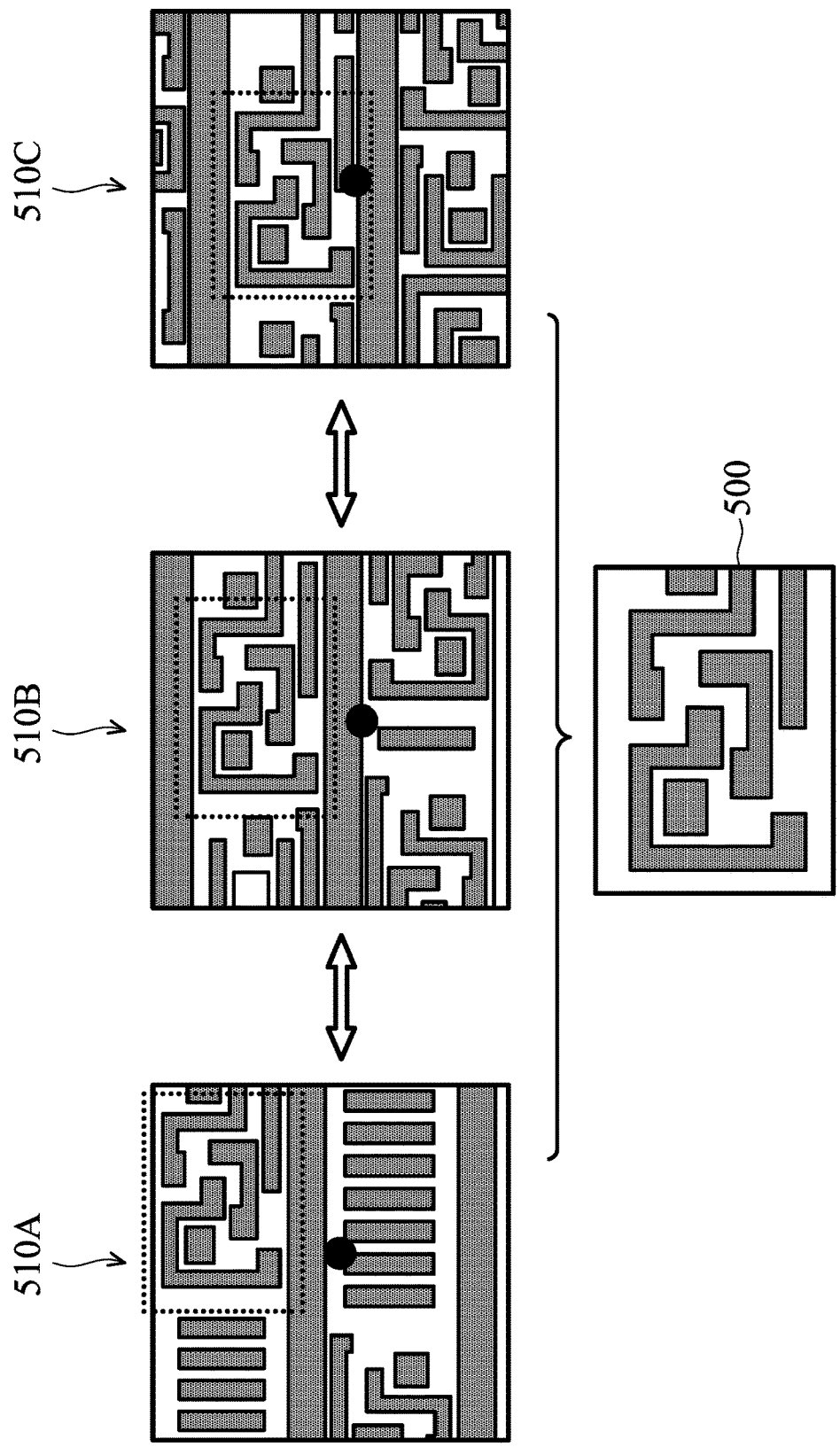
FIG. 5 shows a schematic view of a common pattern in one example, in accordance with some embodiments of the disclosure.

Referring to FIG. 5, FIG. 5 shows a schematic view of a common pattern 500 in one example, in accordance with some embodiments of the disclosure. In the embodiment, the common pattern 500 is obtained from the pattern regions 510A-510C. It should be noted that the patterns of the pattern regions 510A-510C are provided as an example, and not to limit the disclosure. As described above, a first NCC between the pattern regions 510A and 510B is obtained and a second NCC between the pattern regions 510B and 510C is obtained. A maximal NCC between the first NCC and the second NCC is obtained, thereby the common pattern 500 is provided. In the embodiment, the common pattern includes a single-layer pattern formed by a single-layer pattern of a layout of a die. In some embodiments, the common pattern includes a combination pattern formed by a cross-layer composite pattern of a layout of a die. For example, the common pattern is a cross-layer composite pattern formed by a MD layer, a MP layer and a poly gate layer.

Referring back to FIG. 2, after obtaining the common pattern, it is determined whether the common pattern is a known pattern (operation S250). A plurality of known patterns are pre-classified and encoded by unified identification (ID) codes, and stored in a hotspot database. In some embodiments, the known patterns have been obtained in previous inspections. In some embodiments, the known pattern of the defect has no effect on the dies. If the known pattern has a great impact on the dies, an improvement procedure is performed through masks, layout and/or processes.

If the common pattern is known, e.g. the common pattern is identical to one of the known patterns, the amount of the common pattern is updated (operation S260). In some embodiments, the amount of the common pattern is updated by increasing the amount by one.

Figure 6:
FIG. 6 shows a schematic view of the amount of each known pattern in one example, in accordance with some embodiments of the disclosure.

Referring to FIG. 6, FIG. 6 shows a schematic view of the amount of each known pattern in one example, in accordance with some embodiments of the disclosure. In FIG. 6, happen-frequencies of six known patterns ID1-ID6 are shown. If the common pattern is identical to one of the known patterns ID1-ID6, the amount of the corresponding known pattern is updated by increasing the number of times by one. In the embodiments, the amount of the known pattern ID1 is higher than that of the known patterns ID2-ID6, and the amount of the known pattern ID2 is higher than that of the known patterns ID3-ID6. Furthermore, the amount of the known pattern ID3 is higher than that of the known patterns ID4-ID6, and the happen-frequencies of the known patterns ID4-ID6 are the same. In some embodiments, if no unknown hotspot is discovered and the happen-frequencies of the whole known patterns are lower than a threshold value, the subsequent process or stage is performed on the semiconductor wafers.

Referring back to FIG. 2, if the common pattern is unknown, e.g. the common pattern is different from the known patterns, the common pattern is assigned as a new known pattern with a new ID code (operation S270). Furthermore, the new known pattern is recorded (or stored) in the hotspot database. Thus, an unknown hotspot is discovered, and a discovery ratio is also increased when one or more semiconductor wafers are inspected.

Referring to FIG. 7, FIG. 7 shows a table 700 of ID codes in one example, in accordance with some embodiments of the disclosure. In table 700, there are five circuit types of ROIs: SRAM, dummy, critical logic, non-critical logic and hotspot. Each circuit type of ROI has its own ID code range. For example, the numbers 1000-1999 belong to the ROIs corresponding to SRAM circuit, and the numbers 2000-2999 belong to the ROIs corresponding to dummy circuit, and so on. In some embodiments, if the common pattern of the hotspot is an unknown pattern, an unused ID code between the numbers 5000-5999 will be assigned to the common pattern. As described above, ID codes are pre-classified and can be added and encoded according to the common pattern.

Figure 8:
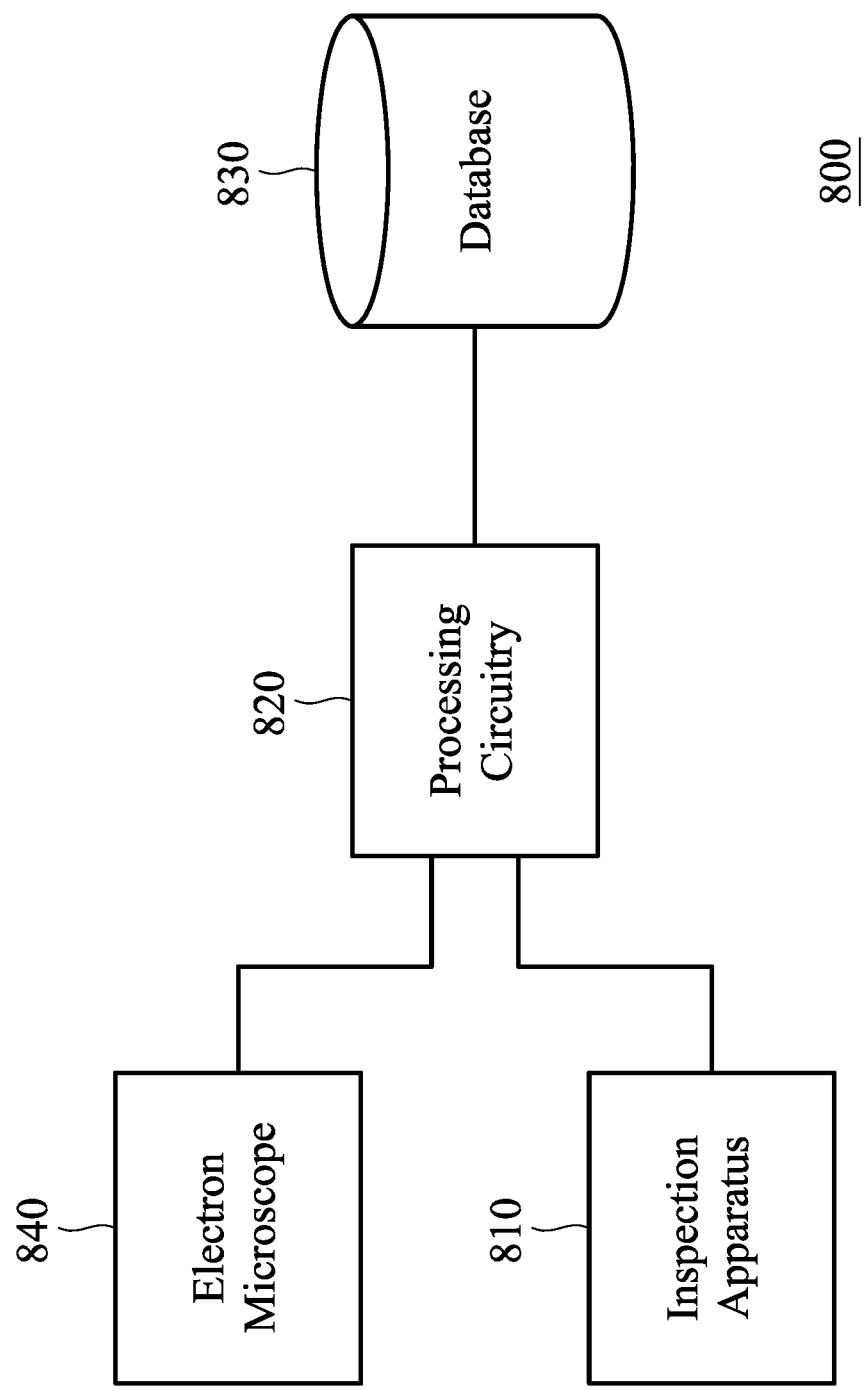
FIG. 8 shows a simplified diagram of a system for detecting hotspots in one or more semiconductor wafers, in accordance with some embodiments of the disclosure.

FIG. 8 shows a simplified diagram of a system 800 for detecting hotspots in one or more semiconductor wafers, in accordance with some embodiments of the disclosure. The system 800 includes an inspection apparatus 810, a processing circuitry 820, a database 830, and an electron microscope 840. The processing circuitry 820 is coupled to the inspection apparatus 810, the database 830 and the electron microscope 840.

A plurality of dies are implemented in one or more semiconductor wafers through various processes and stages at a wafer fabrication facility. When each process or stage is performed, the one or more semiconductor wafers will be inspected through the system 800.

The semiconductor wafers to be inspected are loaded in the inspection apparatus 810. When the semiconductor wafers are loaded in the inspection apparatus 810, the processing circuitry 820 provides information regarding GDS file of the dies in the semiconductor wafers stored in the database 830 to the inspection apparatus 810. Furthermore, the processing circuitry 820 provides information regarding ROIs of the dies to the inspection apparatus 810. In some embodiments, the GDS file and the information regarding ROIs are obtained from a remote server.

According to the GDS file and the information regarding ROIs, the inspection apparatus 810 inspects the one or more semiconductor wafers to obtain a plurality of defect signals, and each defect signal indicates a hotspot of the die in the semiconductor wafer. Furthermore, each defect signal includes information regarding the defect coordinates of the hotspot in a layout of the die.

According to the defect signals from the inspection apparatus 810, the processing circuitry 820 stacks the defect coordinates of the hotspots in the dies to obtain a hotspot distribution.

According to the hotspot distribution and the information regarding ROIs, the processing circuitry 820 determines a location with specific coordinates according to the defect coordinates. In some embodiments, the specific coordinates are determined by selecting the defect coordinates with a higher peak on the Z-axis of the hotspot distribution. In some embodiments, the specific coordinates are determined by selecting the defect coordinates located outside a plurality of known hotspot areas. In some embodiments, the specific coordinates are determined by selecting the defect coordinates located in an ROI corresponding to a specific circuit type.

According to the specific coordinates, the processing circuitry 820 obtains a common pattern according to the hotspots corresponding to the specific coordinate. In some embodiments, a plurality of pattern regions corresponding to the stacked hotspots located in and/or adjacent to the specific coordinates are obtained. The processing circuitry 820 identifies and pre-groups the common pattern according to the pattern regions.

When the common pattern is obtained, the processing circuitry 820 can use the electron microscope 840 to verify or review the defect in the die corresponding to the common pattern. In some embodiments, the electron microscope 840 can be an image capturing mechanism, and the image capturing mechanism is capable of capturing a raw image from the semiconductor wafer.

In some embodiments, after the defect corresponding to the common pattern is verified or reviewed, the processing circuitry 820 will post-group the common pattern.

When the common pattern is obtained, the processing circuitry 820 determines whether the common pattern is a known pattern. In some embodiments, a plurality of known patterns are classified and stored in the database 830.

If the common pattern is known, e.g. the common pattern is identical to one of the known patterns, the processing circuitry 820 updates the amount of the common pattern. If the common pattern is unknown, e.g. the common pattern is different from the known patterns, the processing circuitry 820 assigns the common pattern as a new known pattern with a new ID code. Furthermore, the processing circuitry 820 stores the new known pattern and a known hotspot area corresponding to the common pattern into the database.

According to the inspection, the processing circuitry 820 can provide an inspection result. In some embodiments, the inspection result indicates whether the defects in the semiconductor wafers are normal. Thus, the system 800 is capable of providing in-line inspection of the semiconductor wafers.

If the inspection result is normal, such as no unknown hotspot being discovered and the happen-frequencies of the whole known patterns being lower than a threshold value, the features of the dies in the semiconductor wafers are normal in the current process or stage of manufacturing the semiconductor wafer. In response to the inspection result, the inspection apparatus may unload the semiconductor wafers to perform subsequent processes and/or stages. Conversely, if the inspection result is abnormal, the current process or stage is suspended so that the semiconductor wafers can be checked.

In some embodiments, the inspection apparatus 810, the processing circuitry 820, the database 830, and the electron microscope 840 are integrated in a defect inspection machine.

Embodiments for detecting hotspots in semiconductor wafers are provided. A plurality of defect coordinates of hotspots of the dies of one or more semiconductor wafers are stacked to obtain a hotspot distribution. A common pattern is obtained according to a plurality of pattern regions corresponding to specific coordinates of the hotspot distribution. The specific coordinates are determined by selecting the specific coordinates from the defect coordinates of the defect signals according to a specific rule. When the common pattern is obtained, it is determined whether the common pattern is known, so as to discover unknown hotspots. If the common pattern is unknown, the common pattern is classified and assigned as a known pattern with its ID code. Therefore, product failure analysis (PFA) is performed in an in-line manner, thereby speeding up PFA time. Furthermore, according to the embodiments, automatic algorithm based yield hotspot learning is provided for inline-yield enhancement. Moreover, the method for detecting hotspots in semiconductor wafer is capable of mapping total process window (e.g. Litho/Etch/CMP/ . . . /Lot-to-Lot . . . ) with multi-dies, wafers, and cross-layer design patterns.

In some embodiments, a method for detecting hotspots in semiconductor wafer is provided. At least one semiconductor wafer is inspected to detect a plurality of hotspots of each die in the semiconductor wafer, wherein each of the hotspots has defect coordinates in a layout of the die. The hotspots of the dies are stacked in the layout according to the defect coordinates of the hotspots. A common pattern is obtained according to the stacked hotspots corresponding to a location with specific coordinates in the layout. It is determined whether the common pattern is a known pattern having an individual identification (ID) code. A new ID code is assigned to the common pattern when the common pattern is an unknown pattern.

In some embodiments, another method for detecting hotspots in semiconductor wafer is provided. At least one semiconductor wafer is inspected to obtain a plurality of defect signals from a plurality of dies in the semiconductor wafer, wherein each of the defect signals includes defect coordinates of a hotspot in a layout of the die. The defect coordinates of the defect signals of the dies are accumulated to obtain a hotspot distribution. A common pattern is obtained according to the accumulated defect coordinates of the hotspot distribution located in a specific region-of-interest (ROI) of the layout. A hotspot database is updated according to the common pattern when the common pattern is an unknown pattern that is different from a plurality of known patterns stored in the hotspot databases.

In some embodiments, a system for detecting hotspots in semiconductor wafer is provided. The system includes an inspection apparatus and a processing circuitry coupled to the inspection apparatus. The inspection apparatus inspects at least one semiconductor wafer to detect a plurality of hotspots of each die in the semiconductor wafer, wherein each of the hotspots has defect coordinates in a layout of the die. The processing circuitry obtains the defect coordinates of the hotspots from the inspection apparatus, and stacks the hotspots of the dies in the layout according to the defect coordinates of the hotspots. The processing circuitry obtains a common pattern according to the stacked hotspots corresponding to a location with specific coordinates in the layout, and determines whether the common pattern is a known pattern having an individual identification (ID) code. The processing circuitry assigns a new ID code to the common pattern when the common pattern is an unknown pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for detecting hotspots in semiconductor wafer, comprising:
    inspecting at least one semiconductor wafer to detect a plurality of hotspots of each die in the semiconductor wafer, wherein each of the hotspots has defect coordinates in a layout of the die;
    stacking the hotspots of the dies in the layout according to the defect coordinates of the hotspots;
    obtaining a common pattern according to the stacked hotspots corresponding to a location with specific coordinates in the layout;
    determining whether the common pattern is a known pattern having an individual identification (ID) code; and
    assigning a new ID code to the common pattern when the common pattern is an unknown pattern.

2. The method as claimed in claim 1, further comprising:
    obtaining a plurality of known hotspot areas in the layout, wherein each of the known hotspot areas comprises one of the known patterns having the corresponding ID code;
    selecting the specific coordinates from the defect coordinates of the die, wherein the location with the specific coordinates is outside the known hotspot areas; and
    assigning a new hotspot area having the common pattern according to the new ID code.

3. The method as claimed in claim 1, further comprising:
    classifying the ID codes according to a plurality of circuit types of the known patterns; and
    selecting the specific coordinates from the defect coordinates of the die, wherein the location with the specific coordinates is located in an area corresponding to a specific circuit type.

4. The method as claimed in claim 1, wherein the step of obtaining the common pattern according to the stacked hotspots corresponding to the specific coordinates further comprises:
    obtaining a plurality of pattern regions from the layout according to the stacked hotspots corresponding to the specific coordinates; and
    obtaining the common pattern according to the pattern regions.

5. The method as claimed in claim 4, wherein the pattern regions are the same size, and the stacked hotspot corresponding to the specific coordinates has the defect coordinates adjacent to the specific coordinates.

6. The method as claimed in claim 1, further comprising:
    updating the amount of the known pattern when the common pattern is the known pattern; and
    fabricating a plurality of integrated circuits based on the dies of the semiconductor wafer when the amount of each of the known patterns is lower than a threshold value or no common pattern of the stacked hotspots corresponding to the defect coordinates is the unknown pattern.

7. The method as claimed in claim 1, wherein the common patent comprises a single-layer pattern or a cross-layer composite pattern of the layout.

8. A method for detecting hotspots in semiconductor wafer, comprising:
    inspecting at least one semiconductor wafer to obtain a plurality of defect signals from a plurality of dies in the semiconductor wafer, wherein each of the defect signals comprises defect coordinates of a hotspot in a layout of the die;
    accumulating the defect coordinates of the defect signals of the dies to obtain a hotspot distribution;
    obtaining a common pattern according to the accumulated defect coordinates of the hotspot distribution located in a specific region-of-interest (ROI) of the layout; and
    updating a hotspot database according to the common pattern when the common pattern is an unknown pattern that is different from a plurality of known patterns stored in the hotspot databases.

9. The method as claimed in claim 8, further comprising:
    obtaining a plurality of known hotspot areas in the layout, wherein each of the known hotspot areas comprises one of the known patterns having an individual identification (ID) code;
    selecting the specific ROI according to the known hotspot areas, wherein the specific ROI is outside the known hotspot areas; and
    assigning the specific ROI as a new hotspot area having the common pattern corresponding to a new ID code.

10. The method as claimed in claim 8, further comprising:
    obtaining a plurality of ROIs according to a plurality of circuit types of the known patterns; and
    selecting the specific ROI from the ROIs, wherein the specific ROI corresponds to a specific circuit type.

11. The method as claimed in claim 8, wherein the step of obtaining the common pattern according to the accumulated defect coordinates of the hotspot distribution located in the specific ROI of the layout further comprises:

obtaining a plurality of pattern regions from the layout according to the defect signals of the hotspot distribution located in the specific ROI of the layout; and obtaining the common pattern according to the pattern regions.

12. The method as claimed in claim 11, wherein the pattern regions are the same size, and the defect signals corresponding to the common pattern have the defect coordinates adjacent to each other.

13. The method as claimed in claim 8, further comprising:

updating the amount of the known pattern when the common pattern is the known pattern; and fabricating a plurality of integrated circuits based on the dies of the semiconductor wafer when the amount of each of the known patterns is lower than a threshold value or no common pattern corresponding to the accumulated defect coordinates of the hotspot distribution is the unknown pattern.

14. The method as claimed in claim 8, wherein the common patent comprises a single-layer pattern or a cross-layer composite pattern of the layout.

15. A system for detecting hotspots in semiconductor wafer, comprising:

an inspection apparatus, inspecting at least one semiconductor wafer to detect a plurality of hotspots of each die in the semiconductor wafer, wherein each of the hotspots has defect coordinates in a layout of the die; and a processing circuitry coupled to the inspection apparatus, obtaining the defect coordinates of the hotspots from the inspection apparatus, and stacking the hotspots of the dies in the layout according to the defect coordinates of the hotspots, wherein the processing circuitry obtains a common pattern according to the stacked hotspots corresponding to a location with specific coordinates in the layout, and determines whether the common pattern is a known pattern having an individual identification (ID) code, wherein the processing circuitry assigns a new ID code to the common pattern when the common pattern is an unknown pattern.

16. The system as claimed in claim 15, wherein the inspection apparatus and the processing circuitry are integrated in a defect inspection machine.

17. The system as claimed in claim 15, wherein the processing circuitry obtains a plurality of known hotspot areas in the layout, and each of the known hotspot areas comprises one of the known patterns having the corresponding ID code, wherein the processing circuitry selects the specific coordinates from the defect coordinates of the die, wherein the location with the specific coordinates is outside the known hotspot areas, wherein the processing circuitry assigns a new hotspot area having the common pattern according to the new ID code.

18. The system as claimed in claim 15, wherein the processing circuitry classifies the ID codes according to a plurality of circuit types of the known patterns, and selects the specific coordinates from the defect coordinates of the die, wherein the location with the specific coordinates is located in an area corresponding to a specific circuit type.

19. The system as claimed in claim 15, wherein the processing circuitry obtains a plurality of pattern regions from the layout according to the stacked hotspots corresponding to the specific coordinates, and obtains the common pattern according to the pattern regions.

20. The system as claimed in claim 19, wherein the pattern regions are the same size, and the stacked hotspot corresponding to the specific coordinates has the defect coordinates adjacent to the specific coordinates.

* * * * *